(12) United States Patent
Hirler et al.

(10) Patent No.: US 8,039,894 B2
(45) Date of Patent: Oct. 18, 2011

(54) TRENCH TRANSISTOR AND METHOD FOR FABRICATING A TRENCH TRANSISTOR WITH HIGH-ENERGY-IMPLANTED DRAIN

(75) Inventors: Franz Hirler, Isen (DE); Frank Pfirsch, München (DE)

(73) Assignee: Infineon Technologies, Neubiberg (DE)

( * ) Notice: Subject to any disclaimer, the term of this patent is extended or adjusted under 35 U.S.C. 154(b) by 669 days.

(21) Appl. No.: 11/606,628

(22) Filed: Nov. 30, 2006

(65) Prior Publication Data
US 2007/0190714 A1   Aug. 16, 2007

Related U.S. Application Data

(63) Continuation-in-part of application No. 11/023,038, filed on Dec. 23, 2004, now abandoned.

(51) Int. Cl.
*H01L 29/66* (2006.01)
(52) U.S. Cl. ................. 257/330; 257/E29.024
(58) Field of Classification Search .................. 257/330, 257/E29.024
See application file for complete search history.

(56) References Cited

U.S. PATENT DOCUMENTS

| 5,442,214 A | * | 8/1995 | Yang ............................ 257/328 |
| 5,489,787 A | | 2/1996 | Amaratunga et al. |
| 5,814,858 A | | 9/1998 | Williams |
| 5,929,481 A | * | 7/1999 | Hshieh et al. ................ 257/328 |
| 6,511,886 B2 | | 1/2003 | Kim et al. |
| 2003/0006454 A1 | * | 1/2003 | Darwish ....................... 257/329 |

* cited by examiner

*Primary Examiner* — Jenny L Wagner
(74) *Attorney, Agent, or Firm* — Maginot, Moore & Beck

(57) ABSTRACT

A method is disclosed for fabricating a trench transistor, in which there are formed, within an epitaxial layer deposited above a substrate of a first conductivity type, a trench and, within the trench, a gate dielectric and a gate electrode and, in a body region of a second conductivity type adjoining the trench a source region of the first conductivity type, a drift region of the first conductivity type forming a drain zone being formed at the end of the junction between the substrate and the epitaxial layer by means of one or more high-energy implantations, the lower end of the trench projecting into said drift region, and to a trench transistor of this type formed as a low-voltage transistor.

6 Claims, 11 Drawing Sheets

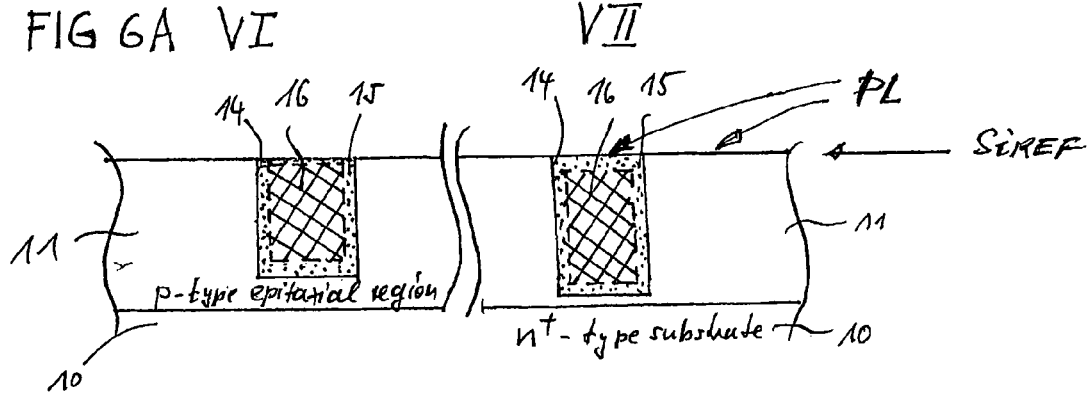
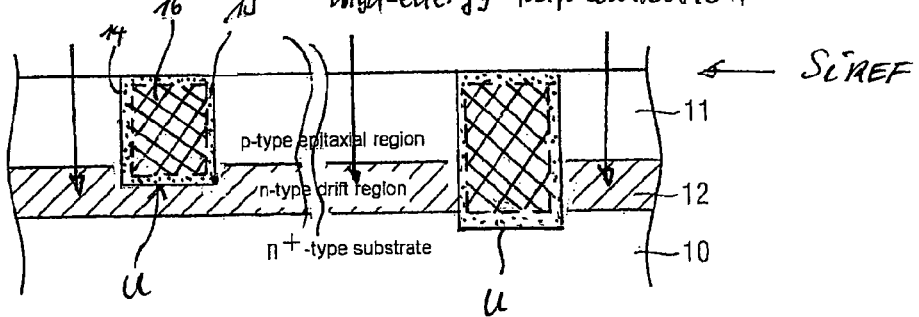
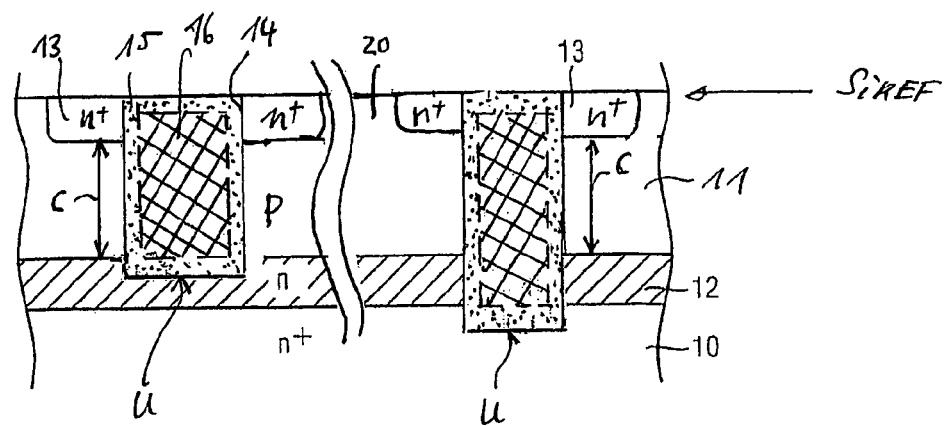

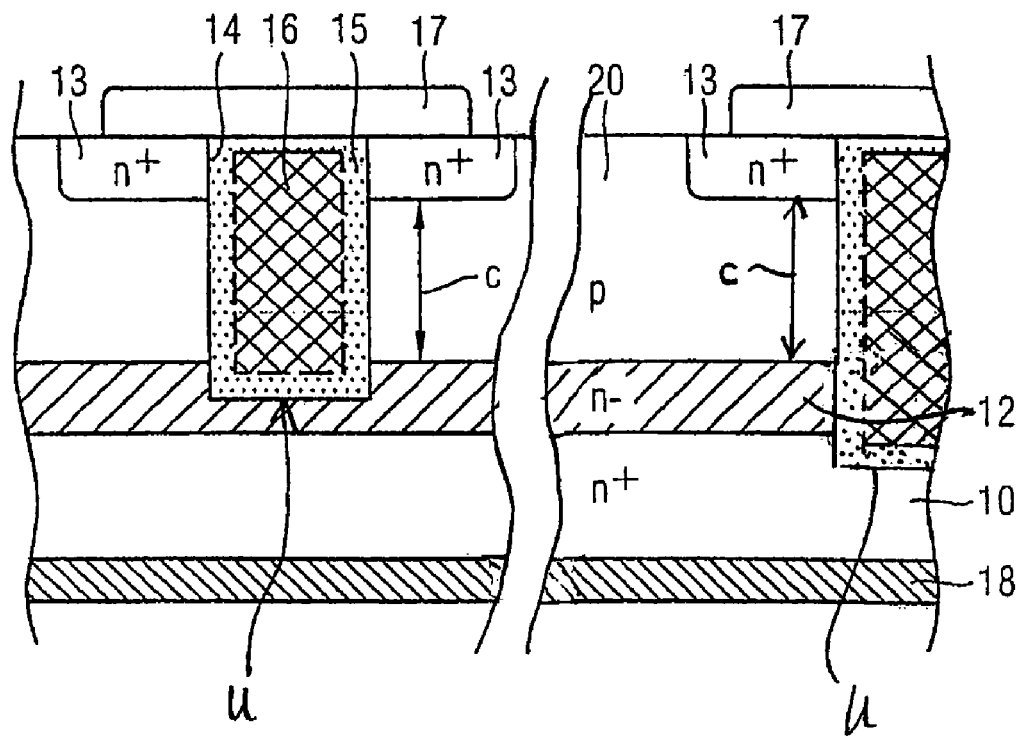

TRENCH TRANSISTOR AND METHOD FOR FABRICATING A TRENCH TRANSISTOR WITH HIGH-ENERGY-IMPLANTED DRAIN

CROSS-REFERENCE TO RELATED APPLICATIONS

This application is a continuation-in-part of U.S. patent application Ser. No. 11/023,038, filed Dec. 23, 2004.

FIELD

The invention relates to the field of trench transistors and also to methods for fabricating trench transistors, and particularly trench transistors in which there are formed, within an epitaxial layer deposited above a substrate of a first conductivity type, a trench and, within the trench, a gate dielectric and a gate electrode and, in a body region of a second conductivity type adjoining the trench a source region of the first conductivity type.

BACKGROUND

An exemplary trench transistor of the field and a related method are disclosed in U.S. Pat. No. 5,814,858 A.

An important aim in the development of new generations of DMOS power transistors is reducing the on resistivity Ron·A. This makes it possible, on the one hand, to minimize the static power loss, and, on the other hand, it is possible to achieve higher current densities. Since the on resistance increases with the maximum drain voltage of a transistor, it is endeavored to manage with lower drain voltages. The specific capacitances responsible for the switching losses are only slightly dependent on the maximum drain voltage, thus resulting in smaller transistors with lower capacitances and lower switching losses.

Usually, for fabricating n-channel DMOS transistors, an n⁻-type epitaxial layer is deposited on a low-impedance n+-type substrate, the lower part of said epitaxial layer forming the drift path. The body region is produced by redoping the epitaxial region. In order to reduce the maximum drain voltage and the on resistivity of such a DMOS transistor, usually the drift path is doped more highly and the length of the drift path is simultaneously reduced. For a maximum drain voltage of less than approximately 20V, the doping of the drift path may become higher than the doping of the body region. However, the transistor can then no longer be fabricated according to the prior art because a reproducible redoping of the more highly doped epitaxial region is not possible.

In order to solve the above difficulties, there is a proposal, for realizing DMOS transistors having a relatively low maximum drain voltage, to deposit a p-type epitaxial layer on an n+-type substrate, said epitaxial layer forming the body region. The drain region is formed by the substrate. In this case, however, the thickness of the epitaxial region is controlled very imprecisely, and the outdiffusion of the substrate varies with the doping concentration thereof, with the result that the channel length is subjected to major fluctuations and the on resistance Ron of the transistor thus fluctuates greatly. Furthermore, there is the proposal to deposit a two-stage epitaxial layer, the bottommost layer of which is n-doped and the top layer of which is p-doped. In the above-mentioned US patent specification, for fabricating a low-voltage MOSFET trench transistor, in order to reduce the deviations of the breakdown voltage and of the on resistance that are caused by the thickness variations of the epitaxial layer, use is made of a high-energy implantation for definition of the drain region.

However, in that case the junction between the epitaxial region and the substrate is defined by the implantation of a buried layer and an n-type epitaxial layer is used. Finally, in the US patent specification, high doses of $1\times10^{14}$ cm$^{-2}$ or more are required for implantation of the buried layer, with the result that the high implantation is not used for definition of the channel length. Furthermore, a certain thickness of the n-type epitaxial layer remains between the top side of the buried layer and the underside of the p-type body.

It would therefore be advantageous to specify a fabrication method for a trench transistor designed for a low maximum drain voltage and a trench transistor of this type in which it is possible to set more precisely the channel length by means of a high-energy implantation and also the doping of the drift region that forms the drain region.

SUMMARY

In accordance with a first embodiment of the invention, a method for fabricating a trench transistor comprises: providing an epitaxial layer disposed above a substrate, the substrate having a first conductivity type; providing a trench and, within the trench, a gate dielectric and a gate electrode; providing a body region of a second conductivity type adjoining the trench and a source region of the first conductivity type disposed within the body region; and forming a drift region of the first conductivity type at the end of a junction between the substrate and the epitaxial layer using one or more high-energy implantations, a lower end of the trench extending at least through a part of said drift region, the drift region including at least a portion of a drain zone.

Consequently, at least one embodiment of the invention likewise proposes a high-energy implantation for definition of the drain region. However, in the case of this embodiment, the drift region which is formed by the high-energy implantation and defines the drain zone sets the junction between the body region and the epitaxial region and thus the channel length. Moreover, this embodiment uses an epitaxial layer which is doped with the second conductivity type (for example p) or else an undoped epitaxial layer, in one case the epitaxial layer forming the later body region without redoping, while in a second case the body region is formed by a redoping by means of implantation and, if appropriate, diffusion of the epitaxial layer.

In one embodiment, the drift region, the body region and the source region of the vertical trench transistor may be formed prior to the formation of the trench. In an alternative embodiment, the drift region, the body region and the source region of the vertical trench transistor may be formed after the formation of the trench and the filling thereof with the gate dielectric and the gate electrode. A preceding planarization, for example by filling with oxide to above the surface and subsequent CMP, is then advisable. The dose proposed by at least one embodiment of the invention for the high-energy implantation of the drift region is approximately $10^{12}$ cm$^{-2}$.

In accordance with one version of the inventive method the lower end of the trench completely extends through the drift region, whereas according to an alternative version the lower end of the trench may be disposed within the drift region.

The trench transistor fabricated according to at least one embodiment of the invention is particularly characterized by the fact that the doping of the drift region is higher than the doping of the body region. In accordance with at least one second embodiment a trench transistor comprises: a substrate having a first conductivity type; an epitaxial layer disposed above the substrate; a trench and, within the trench, a gate dielectric and a gate electrode; a body region of a second conductivity type adjoining the trench, the body region having formed therein a source region of the first conductivity type; and a drift region of the first conductivity type which forms a drain zone, the drift region disposed between the substrate and the epitaxial layer and directly adjoining an underside of the region, a lower end of said trench extending at least through a part of said drift region.

In a preferred exemplary embodiment, the first conductivity type forms the n type and the second conductivity type forms the p type. As an important advantage, in the present method, the steps of providing the body region and the source region and said one or more high-energy implantations to form said drift region are carried out from one and the same reference silicon surface plane.

The above and further advantageous features of a method for fabricating a trench transistor and also of a trench transistor are described in more detail below in exemplary embodiments with reference to the accompanying drawings.

BRIEF DESCRIPTION OF THE DRAWINGS

FIG. 6A-6D show individual fabrication steps of a third exemplary embodiment of a fabrication method according to at least one embodiment of the invention in the form of diagrammatic cross sections, the left sides of FIG. 6A to 6D respectively showing a first variation and the right sides of FIG. 6A to 6D respectively showing a second variation of the third embodiment.

DETAILED DESCRIPTION

Figure 1:
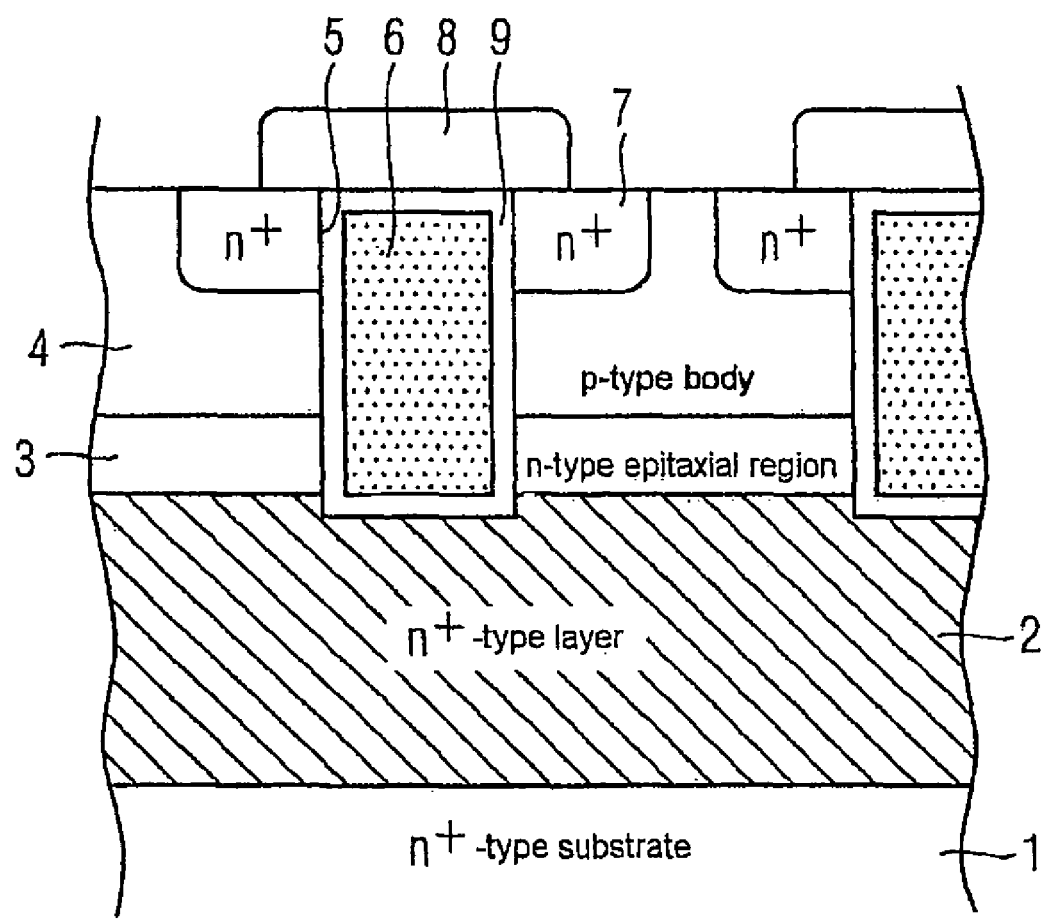
FIG. 1 shows a diagrammatic cross section of the trench transistor known from the document cited in the introduction.

FIG. 1 illustrates the structure of a low-voltage trench transistor known from the document cited in the introduction, in the form of a diagrammatic cross section. In this case, a buried n+-type layer 2 (buried layer) is formed by means of a high-energy implantation in an n-type epitaxial layer 3 lying above an n+-type substrate 1. Redoping of the n-type epitaxial layer 3 produces a p-type body region 4, in the surface of which n+-type source regions 7 are situated. A trench 5 passes down into the buried n+-type layer 2 and a gate dielectric 9 and a gate electrode 6 are formed in the trench. Finally, the source region 7 is contact-connected by a source electrode 8, while the substrate 1 is contact-connected by a drain electrode (not shown). In the case of this trench transistor designed for low drain voltages, the junction between the epitaxial layer 3 and the substrate 1 is defined by the buried n+-type layer. Moreover, in the case of this known trench transistor, the high-energy implantation of the buried n+-type layer 2 is effected with doses of $1 \times 10^{14}$ cm$^{-2}$ or more. In the case of the known trench transistor illustrated diagrammatically in FIG. 1, a region of the n-type epitaxial layer 3 that is not affected by the high-energy implantation is additionally situated between the buried n+-type layer 2 and the p-type body 4.

Figure 2A:
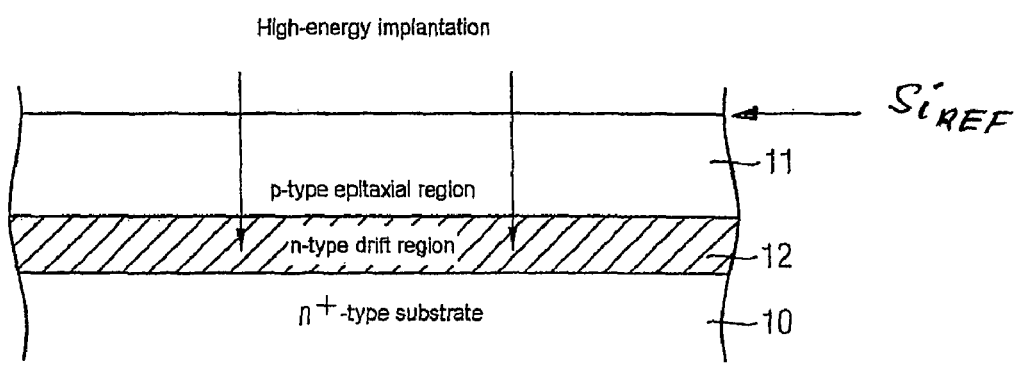
FIGS. 2A-2F show individual fabrication steps of a first exemplary embodiment of the method according to at least one embodiment of the invention in the form of diagrammatic cross sections, FIG. 2A to 2D depicting a first variation and FIGS. 2E and 2F a second variation of the first embodiment.
Figure 2B:
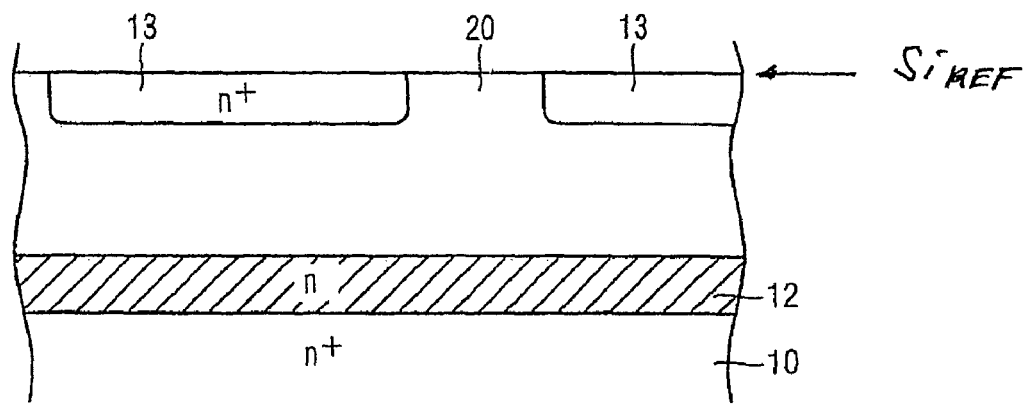

It shall be mentioned here that the various embodiments of the fabrication method according to the invention and of the proposed trench transistor which are described in the description below and are illustrated in FIGS. 2 to 5 are related by way of example to n-channel trench transistors but are not restricted thereto. In the case of the fabrication steps of a first exemplary embodiment of a fabrication method according to the invention which are described in detail with reference to FIGS. 2A-2F, firstly a p-type epitaxial layer 11 is deposited on an n+-type substrate 10, said epitaxial layer forming the later body region without redoping and the surface of said epitaxial layer 11 defining a reference silicon surface plane SiREF. At the end of the epitaxial region/substrate junction, an n-type drift region is formed by redoping the p-type epitaxial region by means of one or more high-energy implantations from said reference silicon surface plane SiREF if appropriate having a different dosage (FIG. 2A). From the same reference silicon surface plane SiREF an n+-type source region 13 is formed in the body region 20 in the p-type epitaxial layer 11 by implantation and, if appropriate, diffusion (FIG. 2B). Afterward, in accordance with FIG. 2C, a trench 14 is introduced through the source region 13 and the body region 20 right into the drift region 12. In other words, according to one variation of the first embodiment the bottom U of the trench 14 extends right into the drift region 12. Afterwards, in accordance with FIG. 2D, a gate dielectric 15 and a gate electrode 16 are formed in the trench 14 and the source region 13 (and, if appropriate, the body region 20) is contact-connected to a source electrode 17 and the substrate 10 is contact-connected to a drain electrode 18.

Figure 2C:
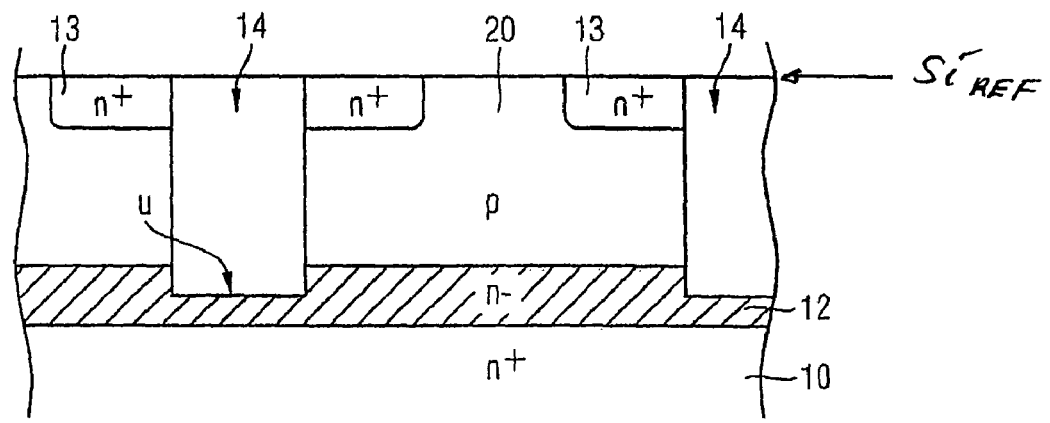
Figure 2D:
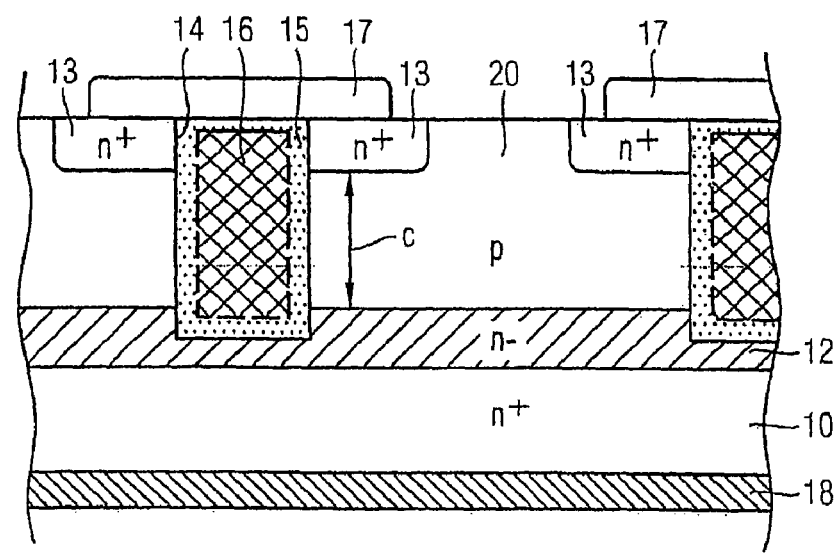
Figure 2:
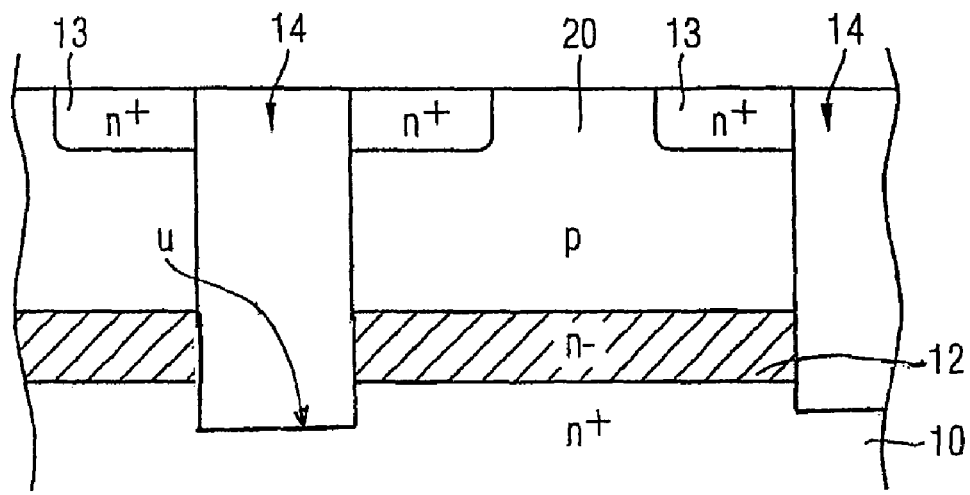
Figure 2:
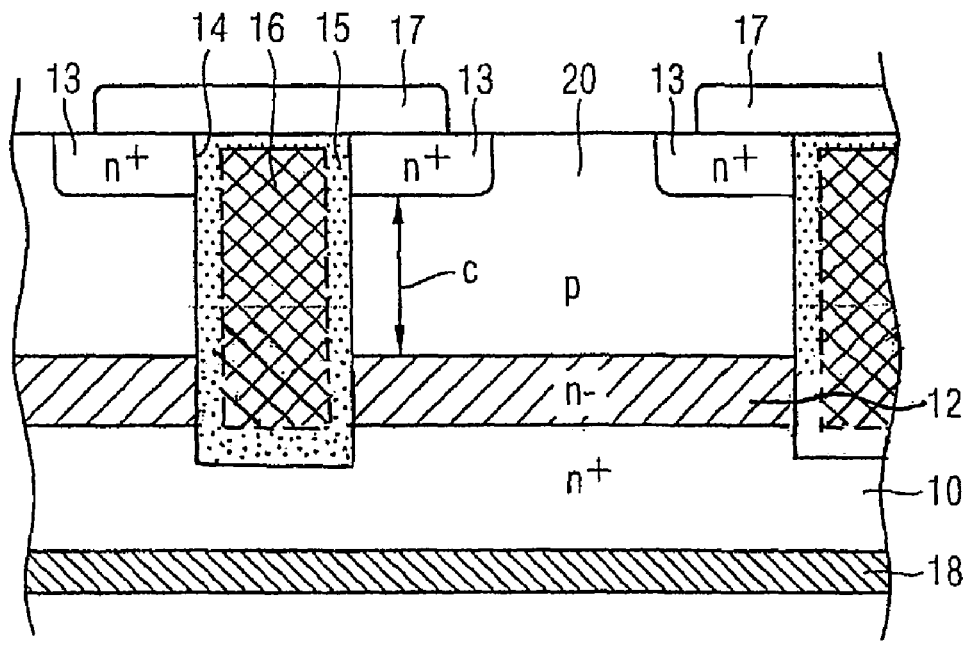

Remarkably, according to the above one variation of the first exemplary embodiment of the method according to the invention as depicted in FIGS. 2C and 2D, the trench 14 is provided so that the lower end, that is the bottom U of the trench 14 is disposed within the drift region 12 whereas according to another variation of the first embodiment of the method according to the invention as depicted in FIGS. 2E and 2F which are respectively corresponding to FIGS. 2C and 2D, the trench 14 is provided so that the lower end of the trench, that is its bottom U, completely extends through the drift region 12.

The channel length indicated by an arrow C in FIGS. 2D and 2F is set according to at least one embodiment of the invention, according to the text above, in an exact and reproducible manner by means of the n-type drift region 12 introduced by high-energy implantation and, if appropriate, diffusion and by providing the n+-type source region 13 both from the same reference silicon surface plane SiREF.

In comparison with FIG. 1 illustrating the trench transistor of the prior art, it is noticeable in FIGS. 2D and 2F that, in the case of the trench transistor according to at least one embodiment of the invention, the upper boundary of the n-type drift region 12 directly adjoins the lower boundary of the p-type body region 20 and thereby unambiguously defines the channel length C. It should additionally be mentioned that the doping of the n-type drift region, that is to day of the drain zone 12, which is achieved by means of the high-energy implantation, may be higher than the doping of the p-type body region 20, which is to be realized for a low-voltage trench transistor (for example for a drain voltage of 15 V) (cf. FIGS. 4 and 5).

Figure 3A:
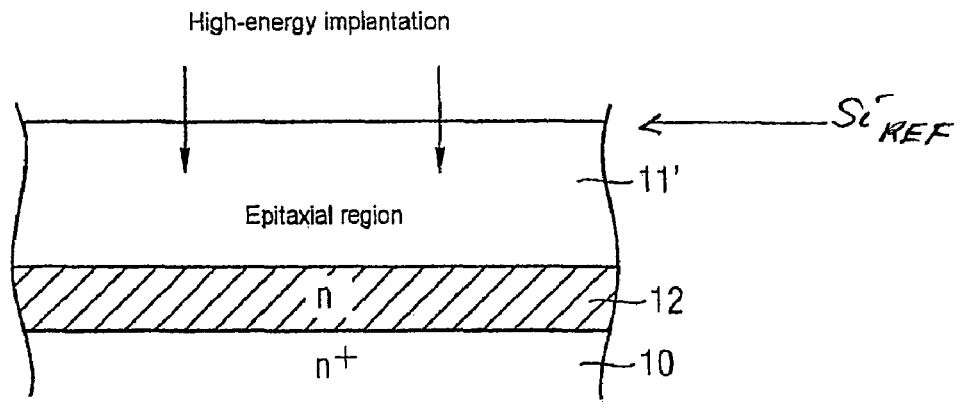
FIGS. 3A-3H show individual fabrication steps of a second exemplary embodiment of a fabrication method according to at least one embodiment of the invention in the form of diagrammatic cross sections, FIG. 3A to 3E depicting a first variation and FIG. 3F to 3H a second variation of the second embodiment.
Figure 3B:
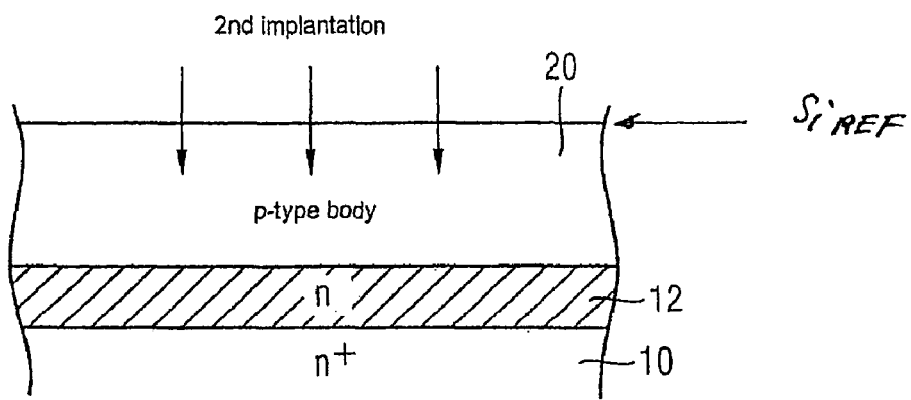
Figure 3C:
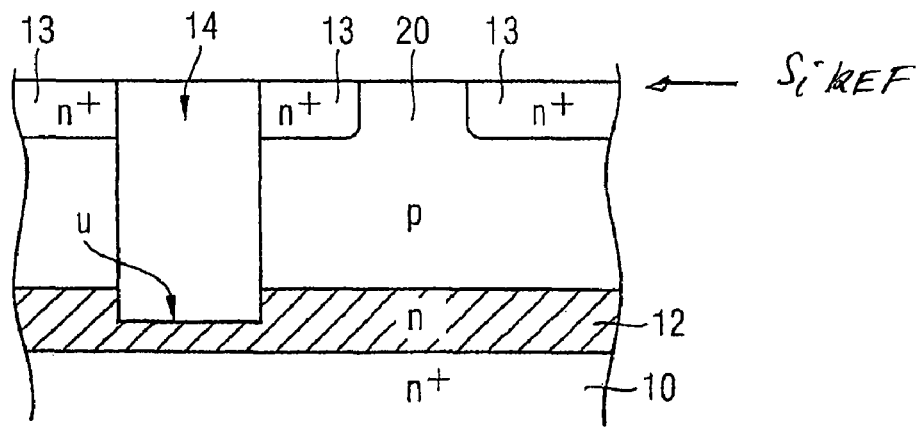
Figure 3D:
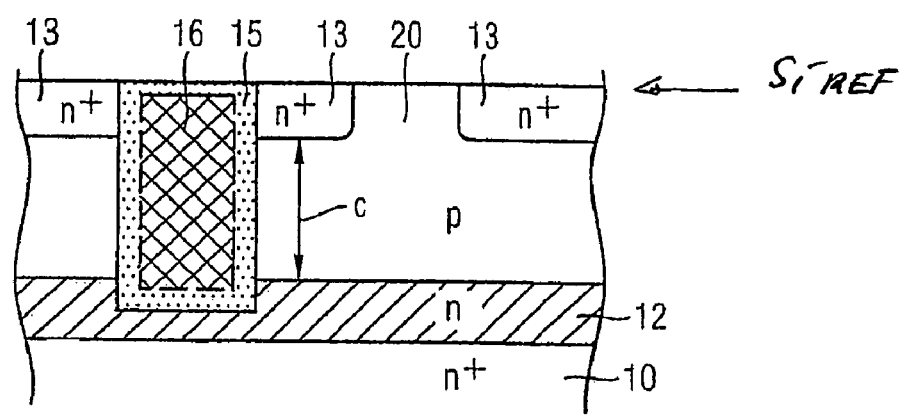
Figure 3E:
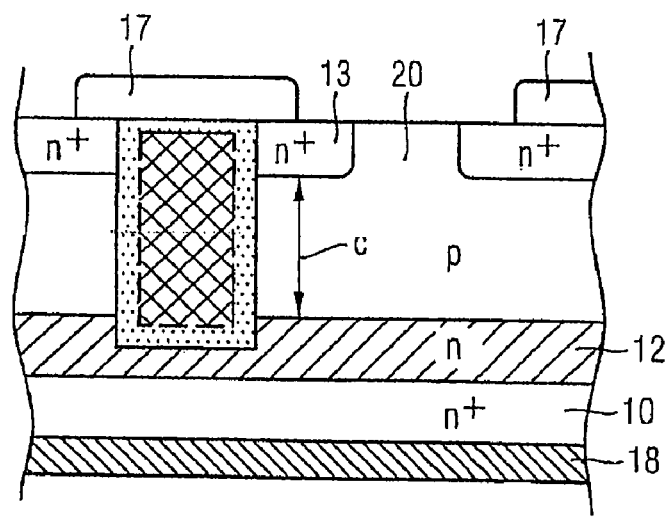
Figure 3F:
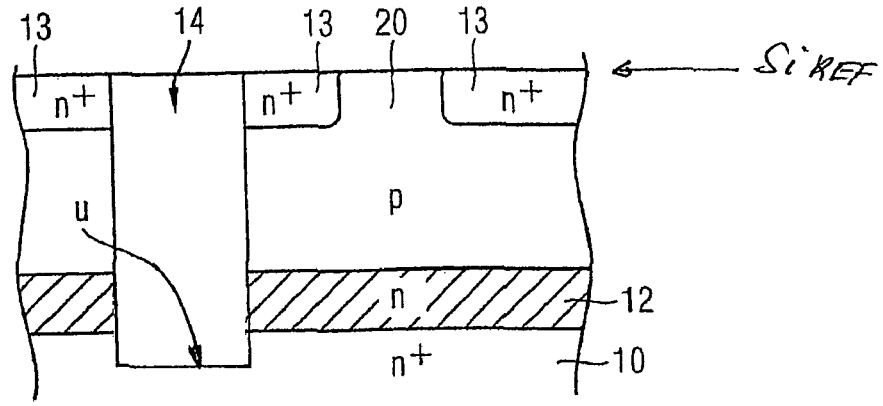
Figure 3G:
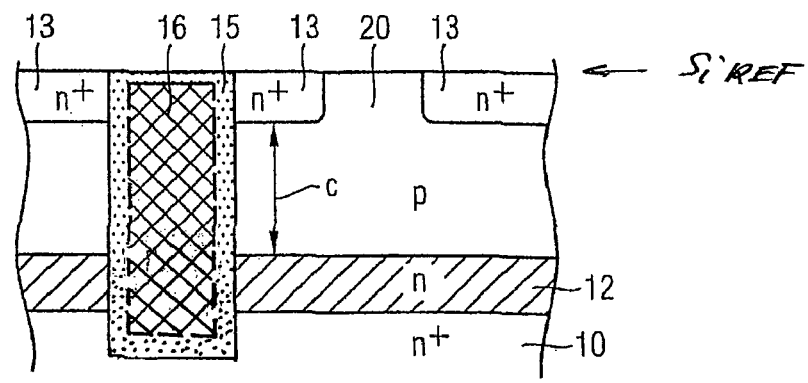
Figure 3H:
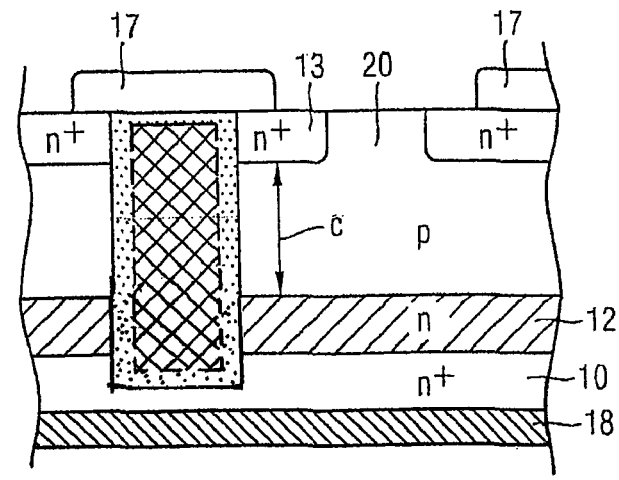

Whereas a p-doped epitaxial layer 11 was formed in the case of the fabrication steps illustrated with reference to FIG. 2A-2F, an undoped epitaxial layer (or p-type or n-type epitaxial layer that is lightly doped in comparison with the dopant concentrations of the finished component) 11' is deposited on the substrate 10 in the case of the second exemplary embodiment, defined by the fabrication steps illustrated in FIG. 3A-3H. The p-type body region 20 is formed by an implantation and, if appropriate, diffusion before or after the high-energy implantation that is used to form the n-type drift region 12 and is illustrated in FIG. 3A. As a result, the dopant concentration of the body region 20 can be set much more accurately than by epitaxial growth. FIG. 3C-3E correspond to the method steps illustrated in FIGS. 2C and 2D and are not explained in any greater detail here. Further, FIG. 3F-3H correspond to FIGS. 2E and 2F and are likewise not explained in greater detail. It is however noticeable, that also in the second variation of the second embodiments of the present fabrication method as depicted in the FIG. 3F-3H, the lower end U of the trench 14 completely extends through said drift region 12. Further, like in the first embodiment of the present fabrication method, the surface of the epitaxial region 11' defines the reference silicon surface plane SiREF for carrying out the high-energy implantation, the second implantation and the formation of the source regions 13 according to FIGS. 3A to 3C.

Practically, the drift region 12, the body region 20 and the source region 13 may be introduced before or after the etching of the trench 14. Particularly if the nigh-energy implantation that is used to form the drift region 12 is performed after the etching of the trench 14, the surface which is not at the same level as the mesa (that is the zone situated next to the trench) may have the effect that the implanted ions experience a different deceleration in the trench than in the mesa and that the implantation peak lies at a different depth which is then subjected to the variations of, in particular, the "poly-recess". According to the first and second exemplary embodiments of the present fabrication method, therefore, the implantation of the drain or drift region 12 is carried out before the trench 14 is actually etched. However, excessively high temperature budgets are then no longer permitted to occur or it is necessary to use dopants that diffuse as slowly as possible for implantation of the drain or drift region.

Figure 4:
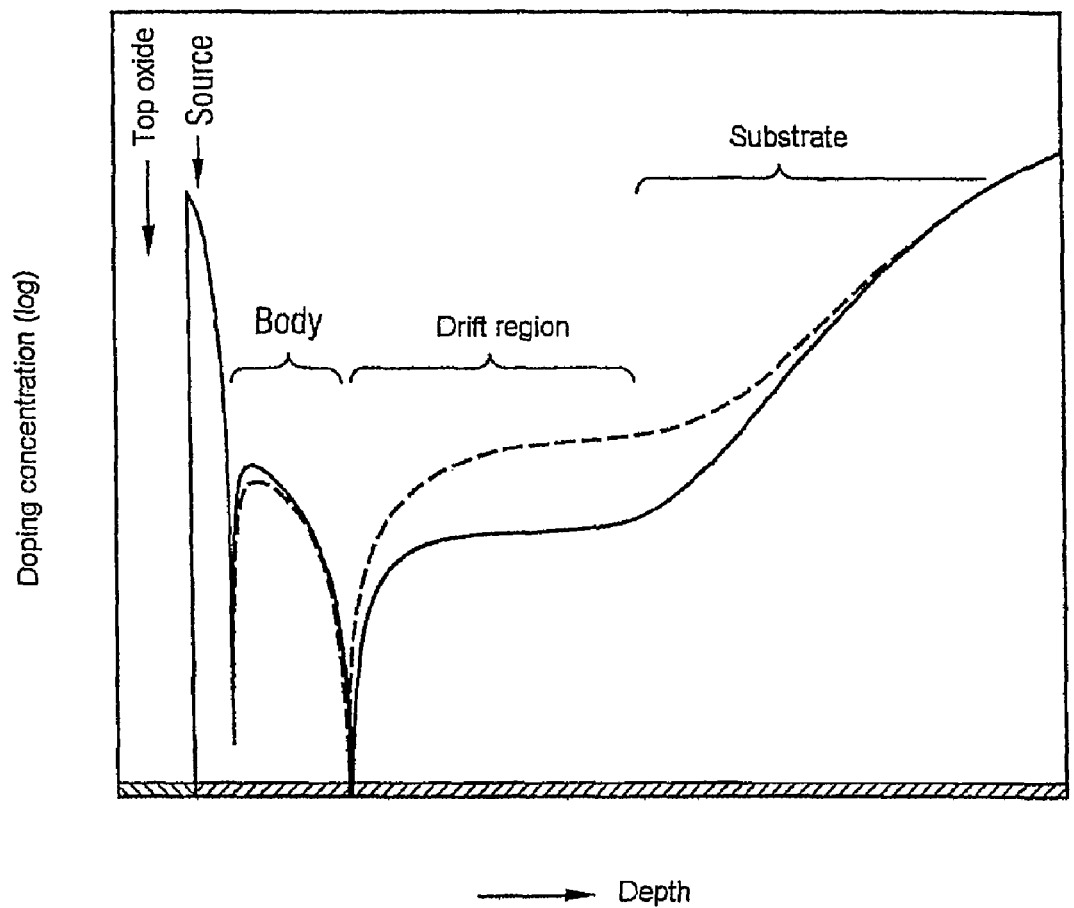
FIG. 4 graphically shows a simulated characteristic by way of example of the absolute values of the net doping concentrations of two trench transistors according to at least one embodiment of the invention in each case with a higher and a lower maximum drain voltage.

FIG. 4 graphically shows the profile characteristic of the doping concentration against the depth of the trench transistor specified in micrometers. The absolute value of the net concentration is plotted logarithmically. The profile characteristic proceeds from the source region illustrated on the left over the body region and the drift region to the substrate situated on the right, which starts approximately at a depth of 3 to 4 µm. The solid curve shows the profile characteristic of a 25 V trench transistor in accordance with the prior art, while the dashed curve shows the profile characteristic of a trench transistor designed for a maximum drain voltage of 15 V. In this case, the dashed curve shows that the doping of the drift region is higher than that of the body region. The lower boundary of the body region and the upper boundary of the drift region coincide at the depth of 1 µm, where they define the end of the channel.

Figure 5:
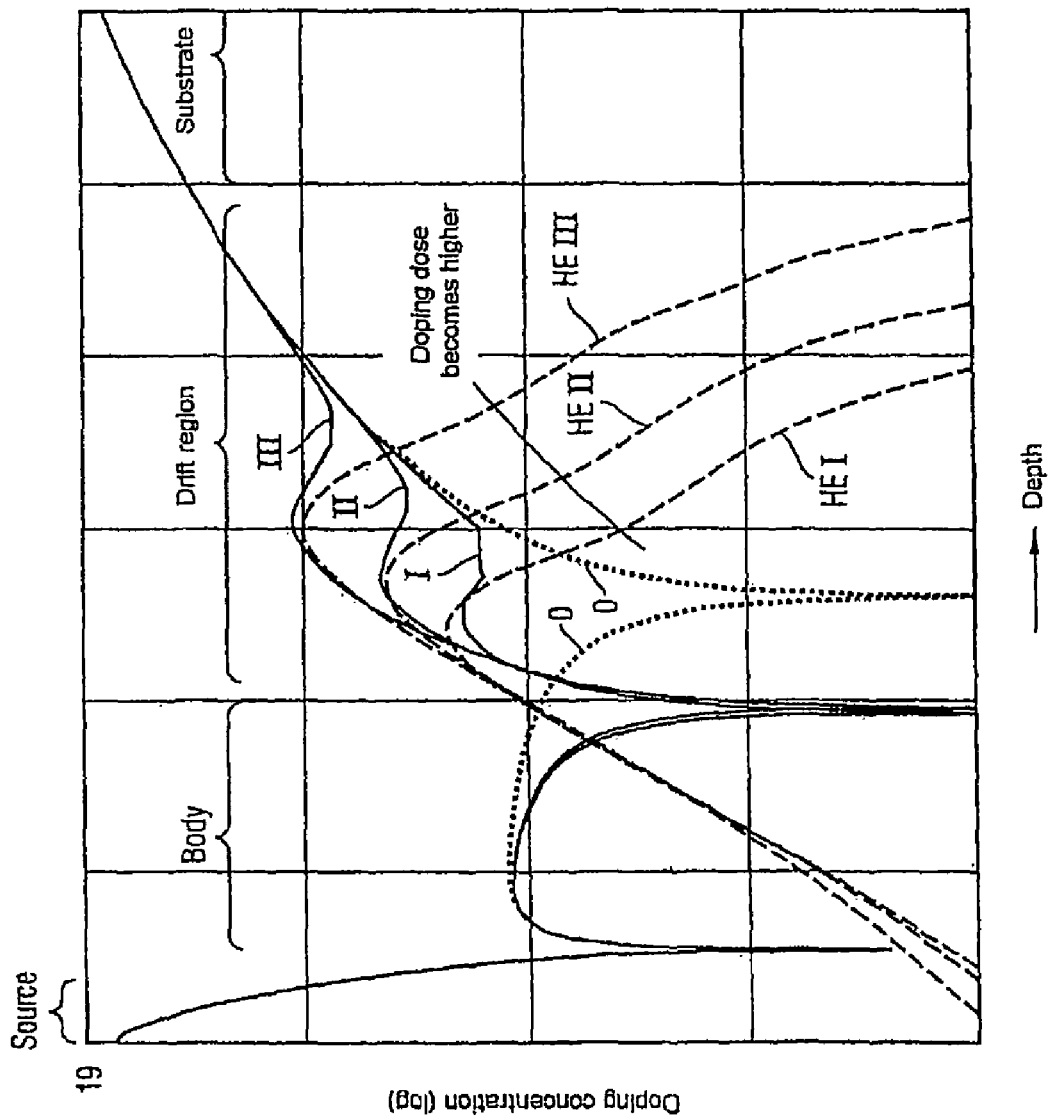
FIG. 5 graphically shows profile characteristics of the doping concentration of three trench transistors according to at least one embodiment of the invention with differently dosed high-energy drain implantation in comparison with the absolute values of the net doping of a trench transistor with a p-type epitaxial layer without high-energy drain implantation.

FIG. 5, which is a graphical illustration similar to FIG. 4, shows in dotted fashion the net doping of a trench transistor with a p-type epitaxial layer without high-energy drain implantation (curve 0). Uninterrupted curves I, II, III show the profile characteristic of the doping concentration (logarithmic) of a low-voltage trench transistor according to at least one embodiment of the invention with three different doping doses of the drain or drift region 12. The dashed curves HEI, HEII, HEIII show the profile characteristic of the doping concentration of the associated high-energy drain implantation, the doping dose and also the implantation energy increasing from HEI through II HEII to HEIII. It holds true also for the low-voltage trench transistors according to at least one embodiment of the invention illustrated in FIG. 5 that the doping of the drain or drift region is higher than that of the body region.

The third exemplary embodiment of the present fabrication method as depicted in the FIG. 6A-6D proposes to carry out the high-energy implantation after the etching of the trench 14 and the introduction of oxide and electrode into the trench 14. A preceding planarization of the surface for example by filling with oxide to above the surface and subsequent CMP is then ideal.

The enclosed FIGS. 6A to 6D show individual fabrication steps of the third exemplary embodiment of the fabrication method according to the invention in the form of diagrammatic cross-sections. Remarkably, the left sides of FIGS. 6A to 6D respectively show a first variation VI of the third exemplary embodiment of the fabrication method according to the invention whereas the right sides of FIGS. 6A to 6D respectively show a second variation reference VII of said third exemplary embodiment of the fabrication method according to the invention. Both variations VI and VII of the third exemplary embodiment are equal in that the high energy implantation depicted by arrows in FIG. 6B and the forming of the p-type body region 11 and the n+-type source regions 13 within the p-type body region 11 according to FIG. 6C are carried out altogether from the same reference silicon surface plane which is depicted with the reference sign SiREF in FIGS. 6A to 6C.

The first variation VI depicted on the left side of FIG. 6A differs from the second variation VII shown in the right side of FIG. 6A to 6D in that according to the first variation VI the lower end of the trench 14 corresponding to the bottom U of the trench 14 is disposed within the drift region 12 whereas according to the second variation VII the lower end of the trench 14 corresponding to its bottom U completely extends through the drift region 12.

A description has been given above of individual method steps of three exemplary embodiments of a method for fabricating a low-voltage n-channel trench transistor according to various embodiments of the invention and an exemplary doping concentration characteristic of a low-voltage trench transistor of this type. It is immediately apparent to the person skilled in the art that the feature of the fabrication method according to at least one embodiment of the invention, which resides in introducing a high-energy implantation for forming the drain or drift region, applies equally to a low-voltage p-channel trench transistor.

As it is shown in FIGS. 2D, 2F, 3E, 3H and 6D a trench transistor according to at least one embodiment of the present invention comprises: a substrate 10 having a first conductivity type, for example an n+-type substrate, an epitaxial layer 11 disposed above the substrate 10, a trench 14 and within the trench a gate dielectric 15 and a gate electrode 16, a body region 20 of a second conductivity type, for example the p-Type adjoining the trench 14, the body region having formed therein a source region 13 of the first conductivity type, according to the above for example the n+-type and a drift region 12 of the first conductivity type, e.g., the n-type, which forms a drain zone, the drift region 12 disposed between the substrate 10 and the epitaxial layer 11 and directly adjoining an underside of the body region 20, wherein a lower end of said trench extends at least through a part of said drift region 12. That is according to one variation of the embodiments as shown for example in FIG. 2O, 3E and VI of FIG. 60 said lower end of said trench 14 is disposed within said drift region 12. According to another variation of the embodiments shown for example in FIG. 2F, 3H and VII of FIG. 60 said lower end of said trench 14 completely extends through said drift region 12.

An advantageous feature similarly provided according to embodiments of the present trench transistor is that first and second p/n junctions respectively formed at the locations of an upper boundary of the drift region 12 and a lower boundary of the source region 13 and thus defines the length C of a channel are all together provided from one and the same reference silicon surface plane SiREF.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for fabricating a trench transistor, comprising the following steps:
    (a) providing an epitaxial layer disposed above a substrate, the substrate having a first conductivity type and the epitaxial layer defining a surface reference plane;
    (b) providing a trench and, within the trench, a gate dielectric and a gate electrode;
    (c) providing a body region of a second conductivity type adjoining the trench;
    (d) providing a source region of the first conductivity type disposed within the body region; and
    (e) forming a drift region of the first conductivity type at the end of a junction between the substrate and the epitaxial layer using one or more high-energy implantations, a lower end of the trench extending at least through a part of said drift region, said drift region separating said body region from said substrate;

wherein:
the step (c) of providing the body region, the step (d) of providing the source region, and the step (e) of forming the drift region by said one or more high-energy implantations are each carried out from and through said surface reference plane, so that each of said steps (c), (d), and (e) are carried out from one and the same surface reference plane,
the step (e) of forming the drift region, the step (c) of providing the body region, and the step (d) of providing the source region occur prior to the step (b) of providing the trench, so that the one or more high-energy implantations are performed through the epitaxial layer; and
the step (b) is carried out such that the lower end of the trench completely extends through the drift region.

2. The fabrication method as claimed in claim 1, wherein providing the epitaxial layer further comprises depositing the epitaxial layer such that the epitaxial layer has a second conductivity type and subsequently, without redoping, forms the body region.

3. The fabrication method as claimed in claim 1, wherein providing the epitaxial layer further comprises providing the epitaxial layer having a first dopant concentration and subsequently forming the body region using the epitaxial layer, the body region having a second dopant concentration that is greater than the first dopant concentration.

4. The fabrication method as claimed in claim 1, wherein forming the drift region further comprises using a high-energy implantation dose of approximately $10^{-13}$ cm$^{-2}$ to $5*10^{-13}$ cm$^{-2}$.

5. The fabrication method as claimed in claim 1, wherein the first conductivity type comprises an n-type and the second conductivity type comprises a p-type.

6. The fabrication method as claimed in claim 1, wherein a doping concentration of the drift region is greater than a doping concentration of the body region.

* * * * *